United States Patent [19]

Schulz

[11] Patent Number: 4,550,545
[45] Date of Patent: Nov. 5, 1985

[54] VENTILATION INSET FOR SHIELDING CABINS AND ROOM SCREENING DEVICES

[75] Inventor: Hans-Werner Schulz, Wenzenbach, Fed. Rep. of Germany

[73] Assignee: Siemens Aktiengesellschaft, Berlin and Munich, Fed. Rep. of Germany

[21] Appl. No.: 497,811

[22] Filed: May 25, 1983

[30] Foreign Application Priority Data

May 28, 1982 [DE] Fed. Rep. of Germany ....... 3220287

[51] Int. Cl.⁴ .............................................. E04C 2/32
[52] U.S. Cl. ...................................... 52/799; 52/807; 52/145
[58] Field of Search ................. 52/799, 144, 145, 807; 98/31

[56] References Cited

FOREIGN PATENT DOCUMENTS 2916478 10/1980 Fed. Rep. of Germany ........ 52/144
909446 5/1946 France ................................. 52/799
8001184 6/1980 Int'l Pat. Institute ................ 52/799

Primary Examiner—Carl D. Friedman
Assistant Examiner—Naoko N. Slack
Attorney, Agent, or Firm—Herbert L. Lerner; Laurence A. Greenberg

[57] ABSTRACT

A ventilation inset for shielded cabins and room screening devices, includes mutually parallel and spaced apart adjacent metal sheets each having slots formed therein, the slots in each of the sheets being shifted relative to the slots in the next adjacent sheet, and a multiplicity of air-permeable waveguides disposed between each two adjacent sheets providing communication between the interior of the cabins and the surroundings.

5 Claims, 8 Drawing Figures

PRIOR ART FIG 1
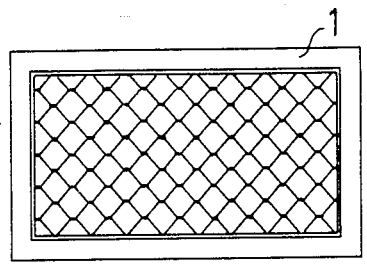
PRIOR ART FIG 2
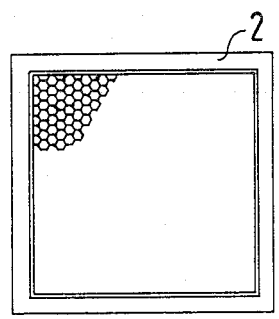
PRIOR ART FIG 3
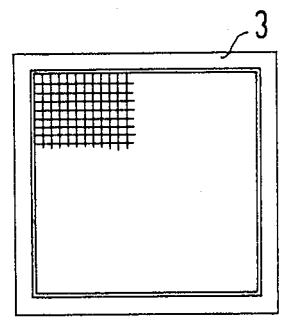
PRIOR ART FIG 4
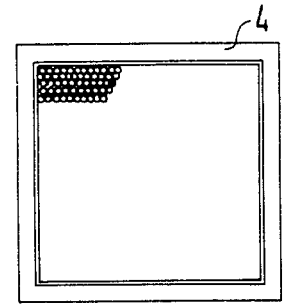

VENTILATION INSET FOR SHIELDING CABINS AND ROOM SCREENING DEVICES

The invention relates to a ventilation inset or insert for shielded cabins or enclosures and room screening devices, with a multiplicity of small wave guides or tubular conductors which are assembled to form an inset, and through which the interior of the cabins and rooms are in air-permeable communication with the outside.

The ventilation insets or windows, which are also known as honeycomb chimney insets, are formed of a multiplicity of waveguides which are disposed side by side and which act as attenuators below their cut-off frequency, i.e., the frequency at which the waveguide conducts. The geometric dimensions of the waveguides, optional additional perforation at the waveguide walls and the size of the inset constructed therefrom, ensure sufficient ventilation and exhaust of shielded rooms.

The prior art ventilation insets, which are discussed in detail below, are all quite expensive to manufacture. They are furthermore difficult to manufacture and have certain structural flaws.

It is accordingly an object of the invention to provide a ventilation inset for shielded cabins and room screening devices which overcomes the hereinafore-mentioned disadvantages of the heretofore-known devices of this general type, which is suitable particularly for high and very high frequencies, is easy to manufacture and meets the presently specified requirements as to its attenuation properties.

With the foregoing and other objects in view there is provided, in accordance with the invention, a ventilation inset for shielded cabins or enclosures and room screening devices, comprising mutually parallel and spaced apart adjacent metal sheets each having slots formed therein, the slots in each of the sheets being shifted or offset relative to the slots in the next adjacent sheet, and a multiplicity of small air-permeable waveguides disposed between each two adjacent sheets providing communication between the interior of the cabins and the surroundings.

In accordance with another feature of the invention, the multiplicity of waveguides are formed of metal strips having a substantially square wave-shape i.e. a continuous or repeated rectangular profile, with flange-like outer surfaces, the flange-like outer surfaces being metallically connected to the metal sheets.

In accordance with a further feature of the invention, the multiplicity of waveguides are formed of metal strips having a substantially sine wave-shape or wavy profile with tangential outer surfaces or wave maxima, the metal strips being metallically connected to the metal sheets in vicinity of the tangential outer surfaces or wave maxima.

In accordance with a concomitant feature of the invention, the metal strips are aligned parallel to the slots formed in the metal sheets as seen in longitudinal direction, and the waveguides are disposed perpendicular to the slots.

Other features which are considered as characteristic for the invention are set forth in the appended claims.

Although the invention is illustrated and described herein as embodied in a ventilation inset for shielding cabins and room screening devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIGS. 1-4 are diagrammatic, front elevational views of prior art ventilation insets;

Figure 5:
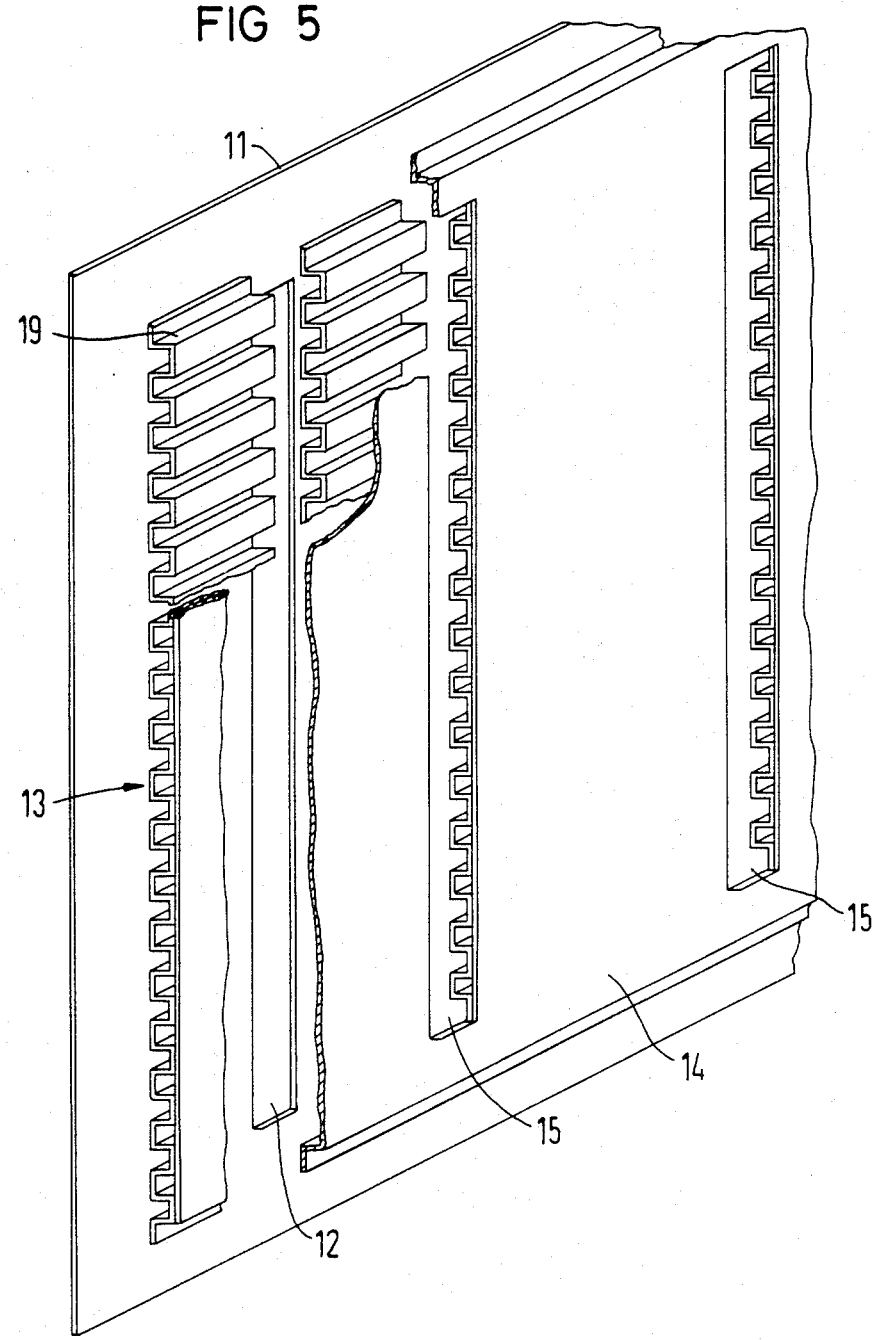
FIG. 5 is a fragmentary, diagrammatic perspective view of a first embodiment of a ventilation inset according to the invention.

Referring now to the drawings in detail and first particularly to FIGS. 1-4 thereof, there are seen conventional honeycomb chimney insets which let in sufficient daylight and simultaneously permit enough ventilation and exhaust. FIG. 1 shows a honeycomb chimney inset 1 which is effective for a cut-off frequency of about 1 GHz and is formed of adjoining, approximately rectangular waveguide or tubular conductor sections which are connected to each other by spot-welding and tin-dipping. The insets 2, 3 according to FIGS. 2 and 3 have waveguides with hexagonal or square cross section and are suitable for a cut-off frequency of about 10 GHz. The honeycomb chimney inset 4 according to FIG. 4 is formed by adjoining capillary waveguides which are soldered to each other and have a cut-off frequency of 35 GHz.

It is a common disadvantage of all heretofore-known honeycomb chimney insets shown, that they can only be manufactured at considerable cost. While the honeycomb chimney insets according to FIG. 1 are mechanically readily machinable, considerable difficulties arise in the assembly and tinning of the sheet metal parts and tubes, especially of the type shown in FIGS. 2 to 4. Firstly, from an economic point of view, the assembly of the individual parts is hardly justifiable; secondly, the honeycomb chimney insets which are immersed in the tin baths for tinning suffer appreciable expansion due to the heat that occurs. Upon cooling, this can lead to cracks, especially in the case of the honeycomb chimney inset according to FIG. 4.

The ventilation inset according to FIG. 5 includes a metal sheet 11, having slots 12 punched therein. Disposed between the slots 12 are metal strips 13 which have a continuous rectangular profile for creating a multiplicity of small waveguides or tubular conductors 19. The metal strips 13 are soldered or welded to the metal sheet 11 with flange-like parts thereof facing the metal sheet. A second preformed metal sheet 14 which has slots 15 offset or shifted relative to the slots 12, is soldered or welded to the parts of the metal strip 13 facing away from the metal sheet 11.

Figure 6:
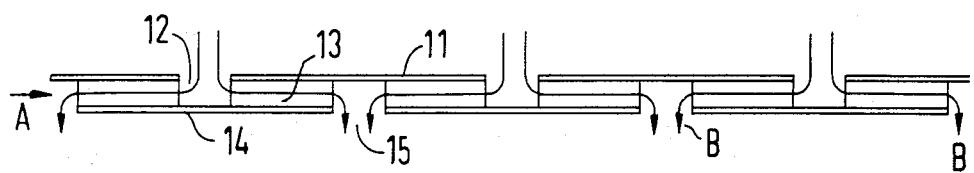
FIG. 6 is a top plan view of the ventilation inset according to FIG. 5.

The operation of this ventilation inset may be seen from FIG. 6. The wave generated by electrical equipment in the interior of the cabin or compartment is deflected in vicinity of the slots 12 through an angle of 90 degrees (along the direction of an arrow B) in the direction toward the slots 15, and the wave travels through the waveguides 19. Naturally, the usual structural formulae with respect to the waveguide cut-off effect apply for this ventilation inset.

Figure 7:
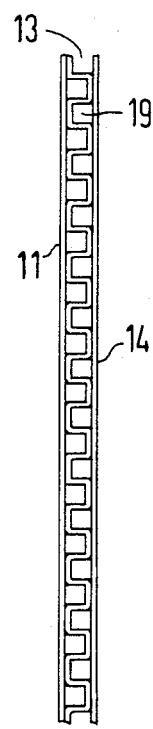
FIG. 7 is a side elevational view of the ventilation inset according to FIGS. 5 and 6, as seen along the direction of the arrow A in FIG. 6.
Figure 8:
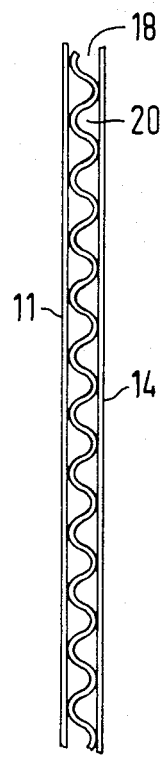
FIG. 8 is a view similar to FIG. 7, of a second embodiment of the structure of the metal strip disposed between the metal sheets.

The ventilation inset shown in FIGS. 5 to 7 can be manufactured in a relatively simple manner. Stiffening may be provided in the supporting metal sheets 11, 14 by bends and creases, so that even comparatively large ventilation insets can be made. Instead of the rectangular shape of the intermediate sheets or sheet metal strips 13, metal strips 18 according to FIG. 8 are also suitable. The metal strips 18 have a wavelike profile for creating a multiplicity of small waveguides 20.

The foregoing is a description corresponding to German Application P No. 3220287.3, dated May 28, 1982, the International priority of which is being claimed for the instant application, and which is hereby made part of this application. Any material discrepancies between the foregoing specification and the aforementioned corresponding German application are to be resolved in favor of the latter.

I claim:

1. Ventilation inset for shielded cabins and room screening devices, comprising mutually parallel and spaced apart adjacent metal sheets each having slots formed therein, said slots in each of said sheets being shifted relative to said slots in the next adjacent sheet, and a multiplicity of air-permeable waveguides disposed between each two adjacent sheets providing communication between the interior of the cabins and the surroundings.

2. Ventilation inset according to claim 1, wherein said multiplicity of waveguides are formed of metal strips having a substantially square wave-shape with flange-like outer surfaces, said flange-like outer surfaces being metallically connected to said metal sheets.

3. Ventilation inset according to claim 2, wherein said slots have a given longitudinal direction, said metal strips are aligned parallel to said slots formed in said metal sheets as seen in said longitudinal direction, and said waveguides are disposed perpendicular to said slots.

4. Ventilation inset according to claim 1, wherein said multiplicity of waveguides are formed of metal strips having a substantially sine wave-shape with tangential outer surfaces, said metal strips being metallically connected to said metal sheets in vicinity of said tangential outer surfaces.

5. Ventilation inset according to claim 4, wherein said slots have a given longitudinal direction, said metal strips are aligned parallel to said slots formed in said metal sheets as seen in said longitudinal direction, and said waveguides are disposed perpendicular to said slots.

* * * * *